United States Patent [19]
Hopkins et al.

[11] Patent Number: 5,737,194
[45] Date of Patent: Apr. 7, 1998

[54] INPUT/OUTPUT MODULE ASSEMBLY

[75] Inventors: George M. Hopkins, Chippewa Falls; Larry Hayes Wood, Fall Creek; Jeffrey Mark Glanzman, Mondovi, all of Wis.

[73] Assignee: Cray Research, Inc., Eagan, Minn.

[21] Appl. No.: 681,944

[22] Filed: Jul. 29, 1996

[51] Int. Cl.⁶ .................................................. A05K 7/14
[52] U.S. Cl. .......................... 361/800; 361/728; 361/729; 361/730; 361/731
[58] Field of Search ............................ 361/728, 729, 361/730, 731, 784, 785, 788, 800, 816, 818, 694, 679, 645, 752, 753, 796, 797, 799, 786; 439/61; 174/35 C, 51; 395/800, 200, 835–839, 828–830, 882, 822; 364/228

[56] References Cited

U.S. PATENT DOCUMENTS

| | | | |
|---|---|---|---|
| 4,227,237 | 10/1980 | Mathews et al. | 361/797 |
| 4,758,924 | 7/1988 | Dillon et al. | 361/692 |
| 5,031,070 | 7/1991 | Hsu | 361/752 |
| 5,301,346 | 4/1994 | Notarianni et al. | 395/800 |
| 5,343,361 | 8/1994 | Rudy, Jr. et al. | 361/710 |
| 5,381,314 | 1/1995 | Rudy, Jr. et al. | 361/712 |
| 5,388,995 | 2/1995 | Rudy, Jr. et al. | 439/61 |
| 5,417,012 | 5/1995 | Brightman et al. | 49/382 |
| 5,461,717 | 10/1995 | Notarianni et al. | 395/200 |
| 5,462,350 | 10/1995 | Brightman et al. | 312/351.7 |

*Primary Examiner*—Leo P. Picard
*Assistant Examiner*—Anthony Dinkins
*Attorney, Agent, or Firm*—Schwegman, Lundberg, Woessner & Kluth, P.A.

[57] ABSTRACT

An input/output module functioning as a peripheral channel adapter or gateway to a network in a high speed digital processing system, the input/output module including a plurality of circuit board assemblies and an enclosure for enclosing the circuit board assemblies, the enclosure including a frame having side panels which are hinged to the frame on opposite sides thereof and movable between closed and open positions for providing access to the circuit board assemblies, a plurality of the input/output modules are enclosed within a housing made of metal, that provides EMI shielding for the input/output modules, the enclosures for the plurality of input/output modules defining metal bulkheads within the housing, and a blower located within the housing forwardly of the input/output modules for circulating cooling air through the input/output modules, the input/output modules being configured so that the volume of cooling air supplied to the application specific assemblies is greater than the volume of cooling air supplied to the power supply assembly.

21 Claims, 16 Drawing Sheets

INPUT/OUTPUT MODULE ASSEMBLY

BACKGROUND OF THE INVENTION

1. Field of the Invention

The present invention pertains generally to the field of high speed digital processing systems of the type that include modular highly interconnected networks, and more particularly, to an input/output module assembly for providing communication between the main frame and peripheral devices of such systems.

2. Background Information

High speed electronic digital computers include modular highly interconnected computer network systems which provide the capability of exchanging information among individual nodes in the network and to share hardware resources. Due to the large amount of data movement in such systems, communication traffic among the nodes can become congested. Several arrangements for reducing congestion have been proposed. One arrangement, commonly referred to as the Scalable Coherent Interface, is a single ring network that increases throughput through the network by sending data in self-contained packets which have the needed address, command and data. Another arrangement, which is referred to as the Fiber Distributed Data Interface, uses a dual-ring configuration that allows the network to remain functional in the event of a fault condition at one of the nodes of the network. Input/output modules provide communication between the network and clients, peripheral devices and other information sources of such systems.

High speed electronic digital computers of the type produced by Cray Research, Inc., the assignee hereof, generally utilize densely packaged or stacked banks of circuit modules, including input/output modules. Each circuit module often includes a plurality of circuit board assemblies each of which carries thereon a number of devices, including numerous integrated circuits which can include circuit, logic and memory devices, for example.

In today's competitive market, the computer industry is driven to reduce the size and increase the speed of computers and components, reduce the number of parts and part variations, reduce manufacturing and assembly complexity, and reduce manufacturing, assembly and part costs. One of the ways the industry has used to achieve the these goals is to produce standardized, interchangeable components and modular assemblies to eliminate the prior practice of using custom designed components. However, input/output modules are intended to serve as interfaces and gateways for a wide variety of information sources and as such do not lend themselves to standardization. Accordingly, input/output modules are produced as application specific circuit assemblies.

Another consideration in high speed electronic digital computers is that cooling must be provided for dissipating heat generated by the electronic devices mounted on the circuit boards. Proper cooling is essential because excess heat can build up, causing malfunction and failure of integrated circuits and other electronic components. The importance of effective and efficient cooling for each application grows as circuit board assemblies become smaller and more densely packed with ever smaller, faster components. One method for cooling circuit assemblies of high speed electronic digital computers is to use a relatively inexpensive, low maintenance air cooling system. The importance of effective and efficient cooling grows as the circuit boards become smaller and more densely packed with even faster components.

SUMMARY OF THE INVENTION

The present invention provides an input/output module assembly for a digital processing system for coupling input/output devices to a network of the system. The input/output module assembly comprises a plurality of circuit board assemblies and an enclosure for enclosing the circuit board assemblies. A first one of the circuit board assemblies includes circuits that are application specific to a given one of an information channel of the system, and a second one of the circuit board assemblies includes circuits that are common to all of the information channels of the system. A connector assembly electrically interconnects the first and second circuit board assemblies to provide a composite circuit board assembly that is application specific to an information channel with which it is used.

In accordance with a feature of the invention, a third one of the circuit board assemblies provides supply voltages for the input/output module. The supply voltages are applied to the circuit bearing the common circuits and being extended therefrom to the application specific circuit board assembly. In accordance with a further feature of the invention, the first circuit board assembly is adapted to be mounted on the second circuit board assembly with component bearing surfaces of the two circuit board assemblies opposing one another and with components of said first and second circuit board assemblies being skylined with one another and the connector assembly interconnects the two circuit board assemblies both mechanically and electrically.

Further in accordance with the invention, there is provided an assembly comprising a plurality of input/output modules, each of the input/output modules including a plurality of circuit board assemblies and an enclosure for enclosing the circuit board assemblies. The enclosure includes a frame having a top, a bottom, a front, a back and first and second sides. The assembly further comprises a housing made of metal and being adapted to receive the input/output modules in side-by-side relation. The housing encloses the input/output modules at least on the top, the bottom, the front, and first and second sides thereof. The enclosure for each of the input/output modules is made of metal, whereby the enclosures for all of the input/output modules define metal bulkheads within the metal housing for the circuit board assemblies of the input/output modules enclosed within the housing. Further in accordance with the invention, an air circulating means is located within an inner chamber of the housing for circulating cooling air through the input/output modules. A metallic shield within the housing is interposed between the input/output modules and the inner chamber of the housing for substantially preventing radiation of high frequency electrical signals from the interior of the housing through the inner chamber thereof. The input/output modules are constructed and arranged so that the volume of cooling air supplied to the composite circuit board assembly is greater than the volume of cooling air supplied to the circuit board assembly that provides the supply voltages for the input/output modules.

DETAILED DESCRIPTION OF THE PREFERRED EMBODIMENTS

In the following Detailed Description, reference is made to the accompanying drawings which form a part hereof and in which is shown by way of illustration specific embodiments in which the invention may be practiced. These embodiments are described in sufficient detail to enable those skilled in the art to practice and use the invention, and it is to be understood that other embodiments may be utilized and that changes may be made without departing from the spirit and scope of the present invention. The following Detailed Description is, therefore, not to be taken in a limiting sense and the scope of the present invention is defined by the appended claims.

Figure 1:
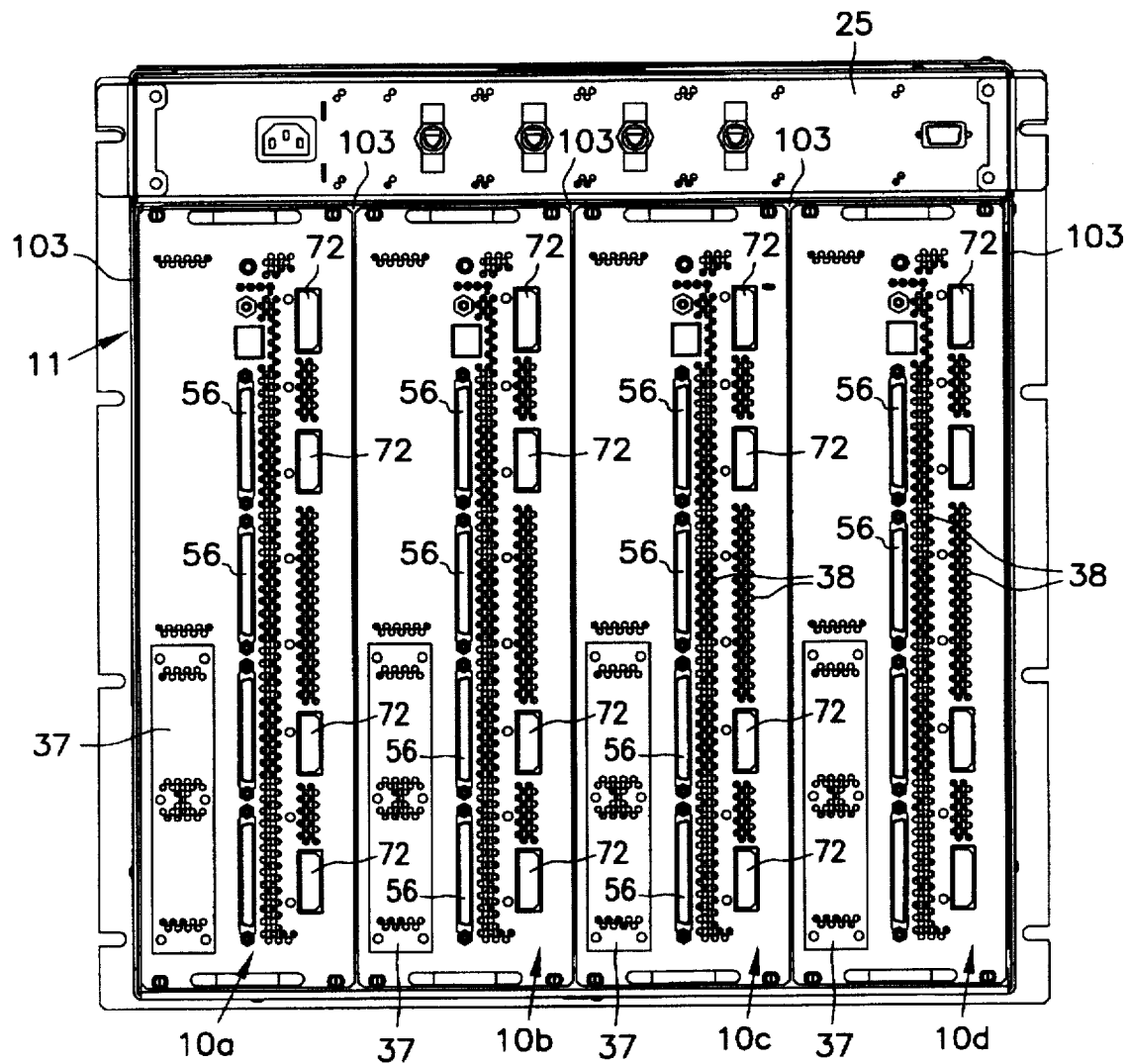
FIG. 1 is a rear elevation view of an input/output module assembly including a subrack assembly and a plurality of input/output modules provided by the invention.

Referring to FIG. 1 of the drawings, the input/output module assembly provided by the invention includes a plurality of input/output modules 10a, 10b, 10c and 10d and a subrack assembly 11 which houses the input/output modules. The input/output module assembly provided by the invention is described with reference to an application in high speed digital processing systems of the type that include modular highly interconnected network systems operating over single or dual ring networks. Each of the input/output modules of the input/output module assembly functions as a peripheral channel adapter and/or a gateway assembly for providing communication between the main frame and a plurality of channels or peripheral devices of the system. Representative channel types and/or peripheral devices include IPI disk type channel, a fiber channel disk, a block multiplex device, a 100 MB/s HIPPI type channel, a 200 MB/s HIPPI type channel, and an ESCON type channel.

Figure 2:
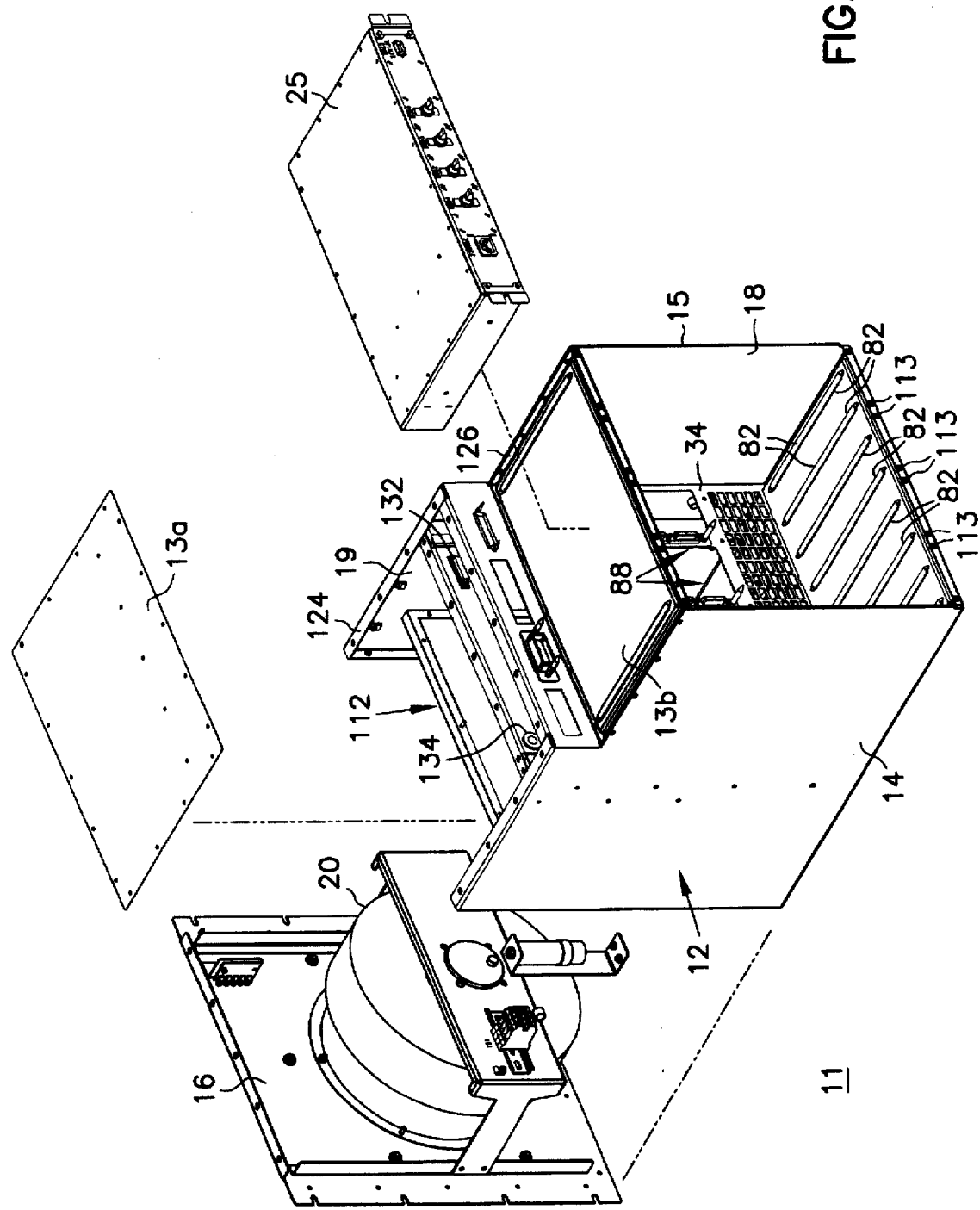
FIG. 2 is an exploded rear perspective view of the subrack assembly of the input/output module assembly of FIG. 1.
Figure 3:
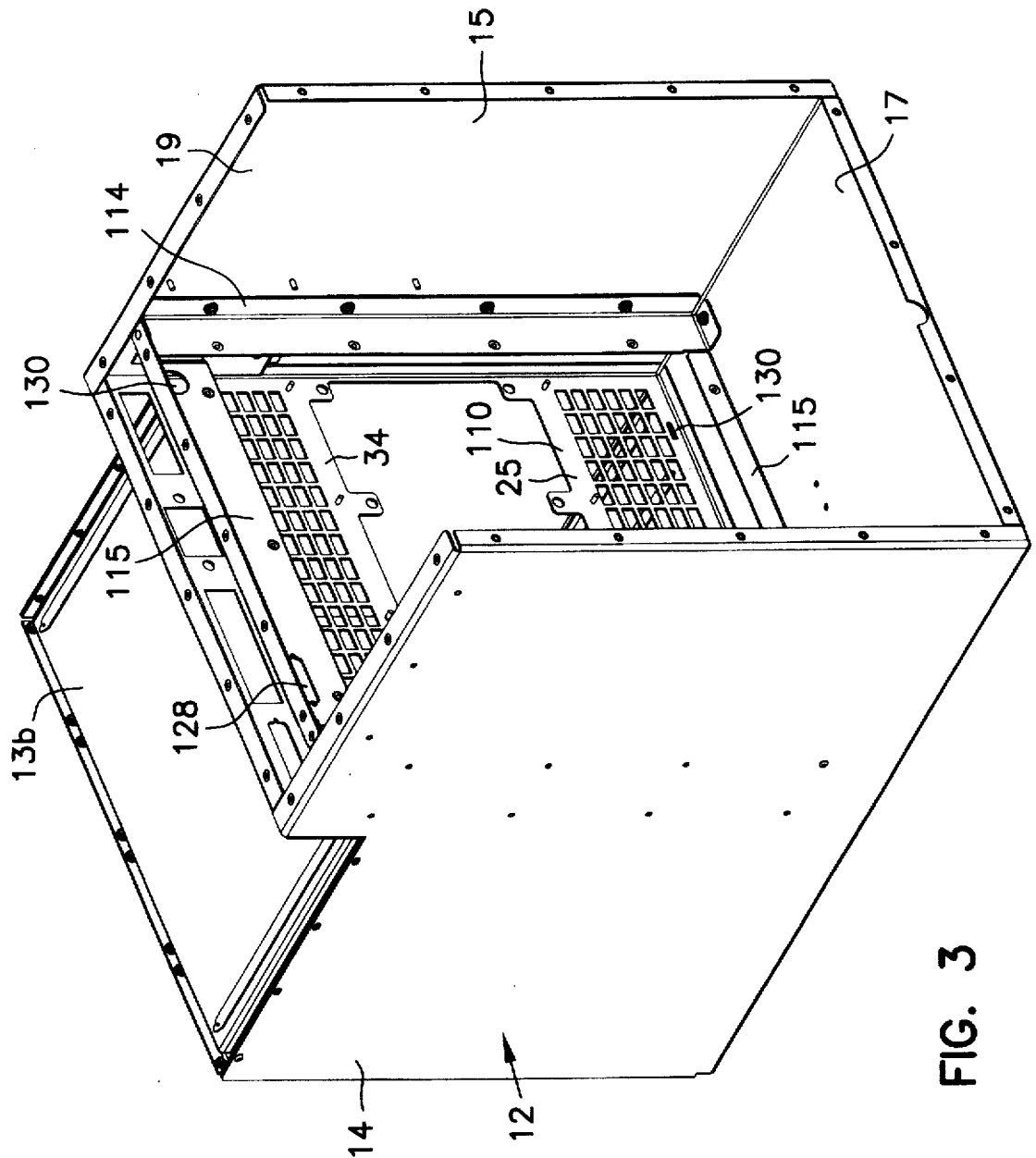
FIG. 3 is a front perspective view of the subrack assembly.
Figure 4:
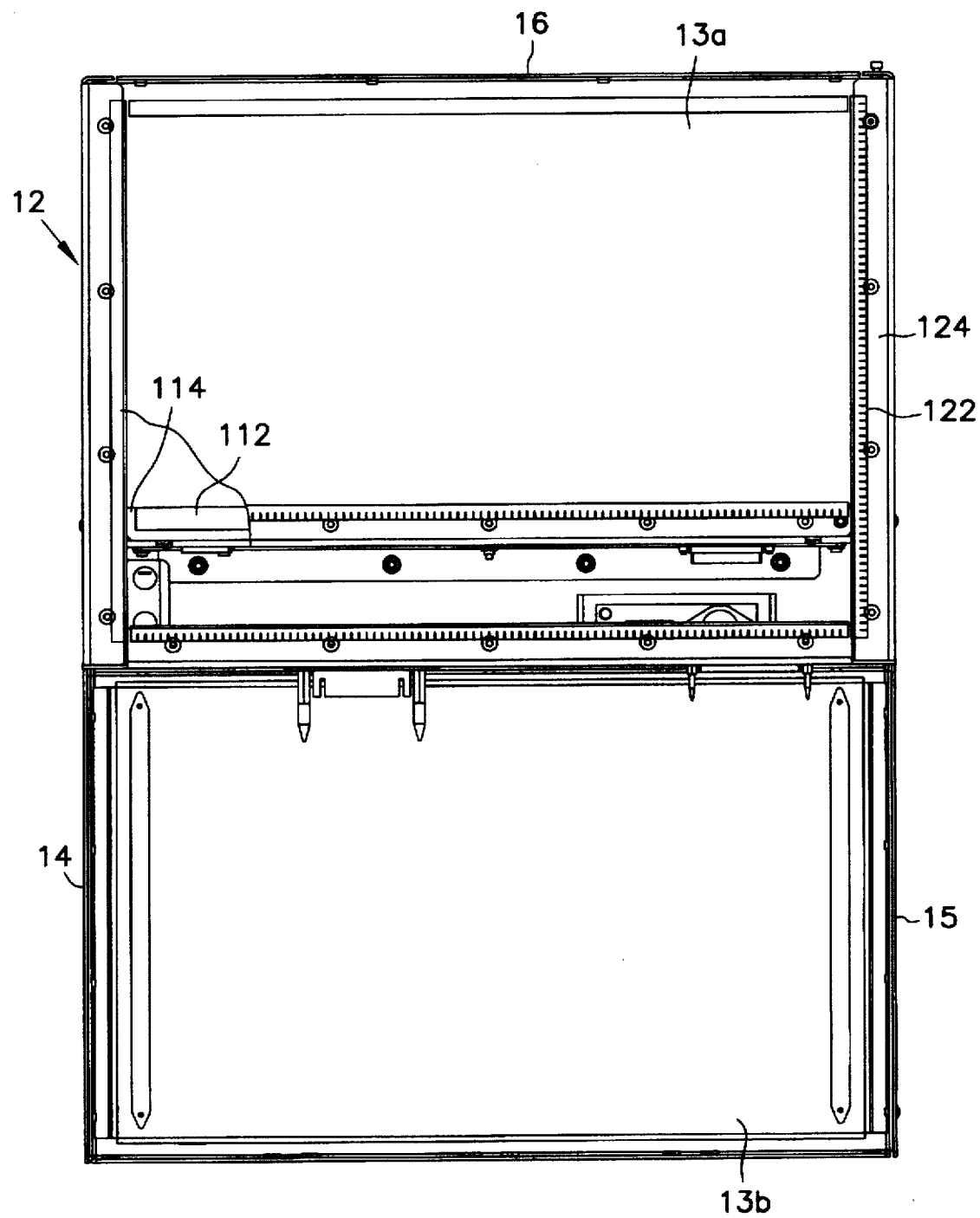
FIG. 4 is a top plan view of the subrack assembly with the forward cover partially cut away to illustrate the EMI screen that is mounted within the plenum at the of the subrack assembly.

Referring additionally to FIGS. 2–4, the input/output modules 10a–10d are mounted in the generally rectangular shaped housing portion 12 of the subrack assembly 11, forming the input/output module assembly, which, in turn, is connected with the main frame of the processing system in which it is used. In the exemplary embodiment, the subrack assembly includes four input/output modules 10a–10d, but the number of input/output modules for a subrack assembly can be four or less as a function of application.

The housing 12 of the subrack assembly 11 is made of a suitable metal, which in one embodiment was steel. The subrack housing 12 includes a forward top plate 13 a, a rearward top plate 13 b, a side 14, a side 15, a front 16 and a bottom 17. The sides 14 and 15 are identical to one another but are oriented in mirror image symmetry. In one embodiment, the sides 14 and 15 and the bottom 17 were formed from one piece of metal bent to a generally U-shaped configuration. An apertured partition 34 divides the interior of the subrack housing 12 into a forward portion 19 and a rearward portion 18. The rearward portion 18 of the subrack housing 12 defines a card cage within which the input/output modules 10a–10d are enclosed. The upper part of the rearward portion 18 of the subrack housing 12 is stepped down to define a mounting area for a power supply module 25, which is mounted on top plate 13b, located above the input/output modules 10a–10d. The forward portion 19 of the subrack housing 12 defines a plenum that is in fluid communication with the input/output modules. When the input/output modules are installed in the subrack housing, the input/output modules are located at the back of the subrack housing. A blower 20 is mounted on the front 16 and is located within the plenum 19 when the front 16 is mounted on the subrack housing 12. The blower circulates cooling air through the input/output modules, providing forced-air cooling of the input/output modules 10a–10d contained within the subrack housing 12.

Referring to FIGS. 5–7, 11 and 12, each input/output module, such as input/output module 10a, includes three printed circuit board assemblies, including a power supply circuit board assembly 21, a peripheral interface circuit board assembly 22, and a peripheral specific channel adapter circuit board assembly 23. The input/output modules include an all metal enclosure 24 for enclosing the printed circuit board assemblies of the input/output module. The enclosure 24 provides mechanical protection for the three circuit board assemblies and provides shielding against electromagnetic and radio-frequency radiation. The power supply circuit board assembly 21, hereinafter referred to as the power supply assembly, is a "generic" board which can be configured to the D.C. voltage requirements for each specific channel. The power supply assembly is "generic" in the sense that this assembly can be used in different input/output modules for providing power for the channels with which the input/output module is associated. The peripheral interface circuit board assembly 22, hereinafter referred to as the peripheral interface assembly, also is a "generic" assembly used in each channel adapter to communicate to the peripheral ring network and the specific channel function. The peripheral interface assembly is "generic" in the sense that this assembly can be used in different input/output modules for providing for channel communication for the channel with which the input/output module is associated. The peripheral specific channel adapter circuit board assembly 23, hereinafter referred to as the peripheral specific channel adapter assembly, is a unique assembly for each channel functional type. However, the peripheral specific channel adapter assembly 23 has board outlines and interfaces that correspond to those of the peripheral interface assembly 22.

Figure 5:
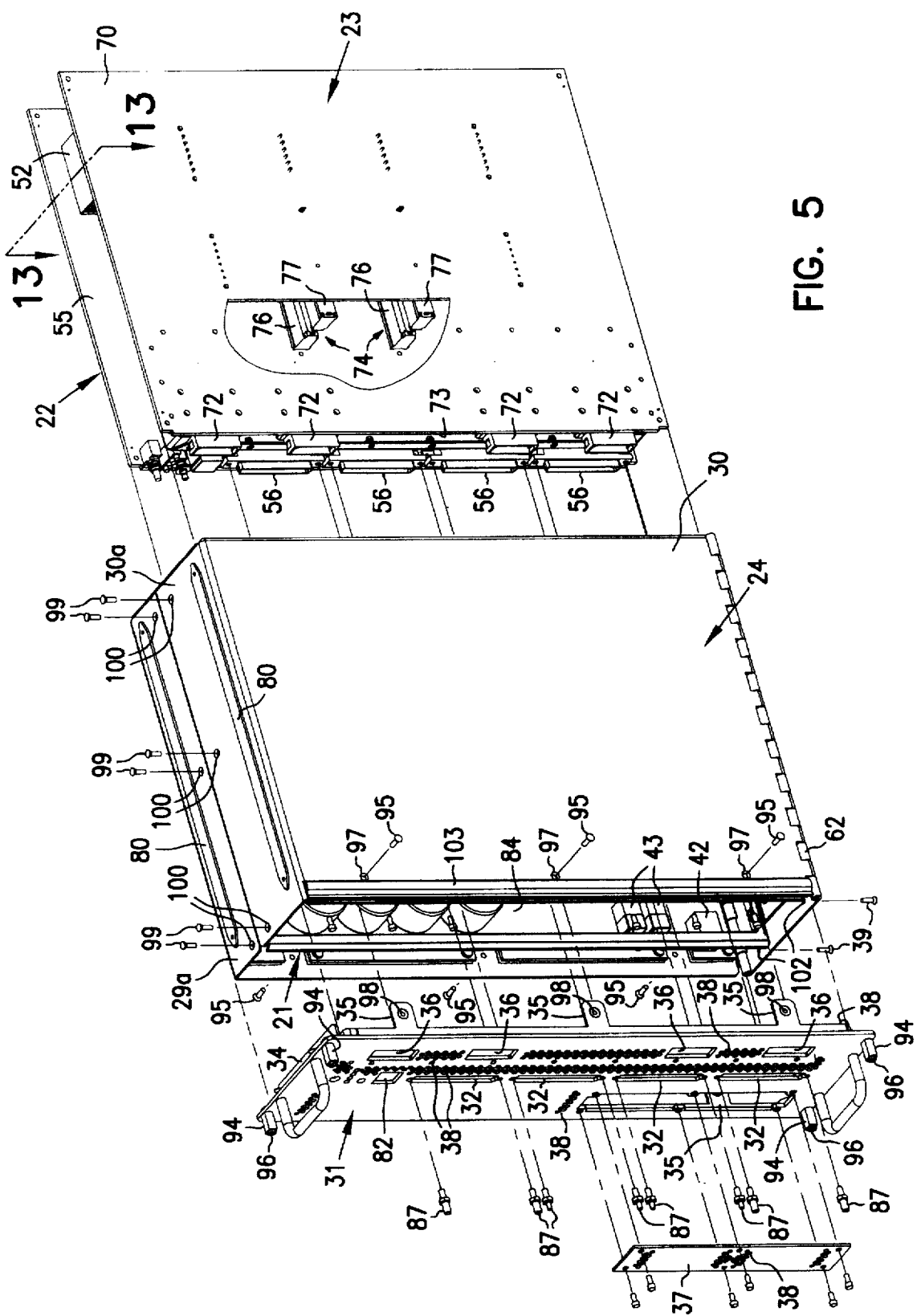
FIG. 5 is an exploded perspective view of one of the input/output modules of the input/output assembly of FIG. 1.
Figure 6:
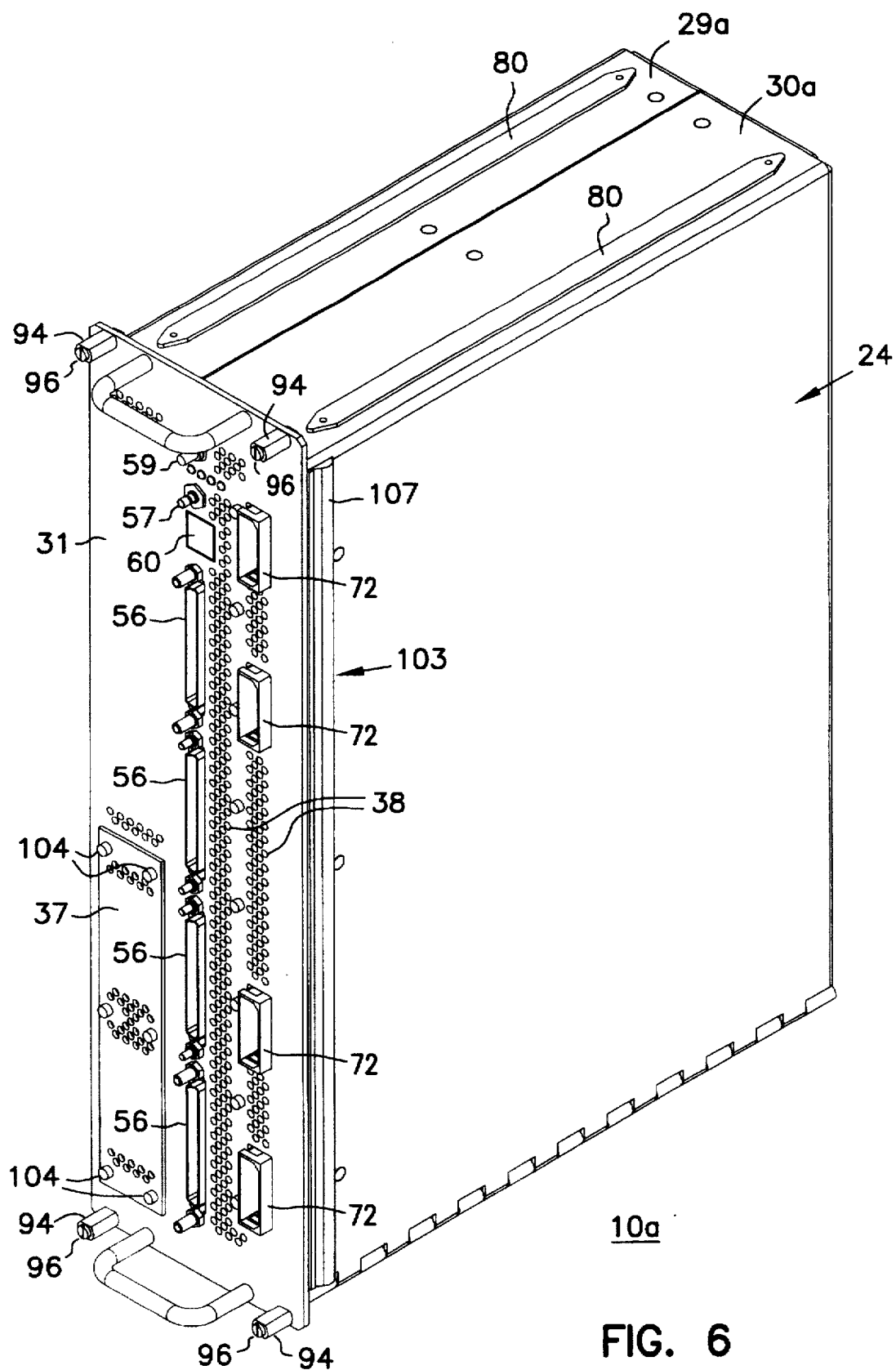
FIG. 6 is a perspective view of the input/output module of FIG. 5, shown assembled.
Figure 7:
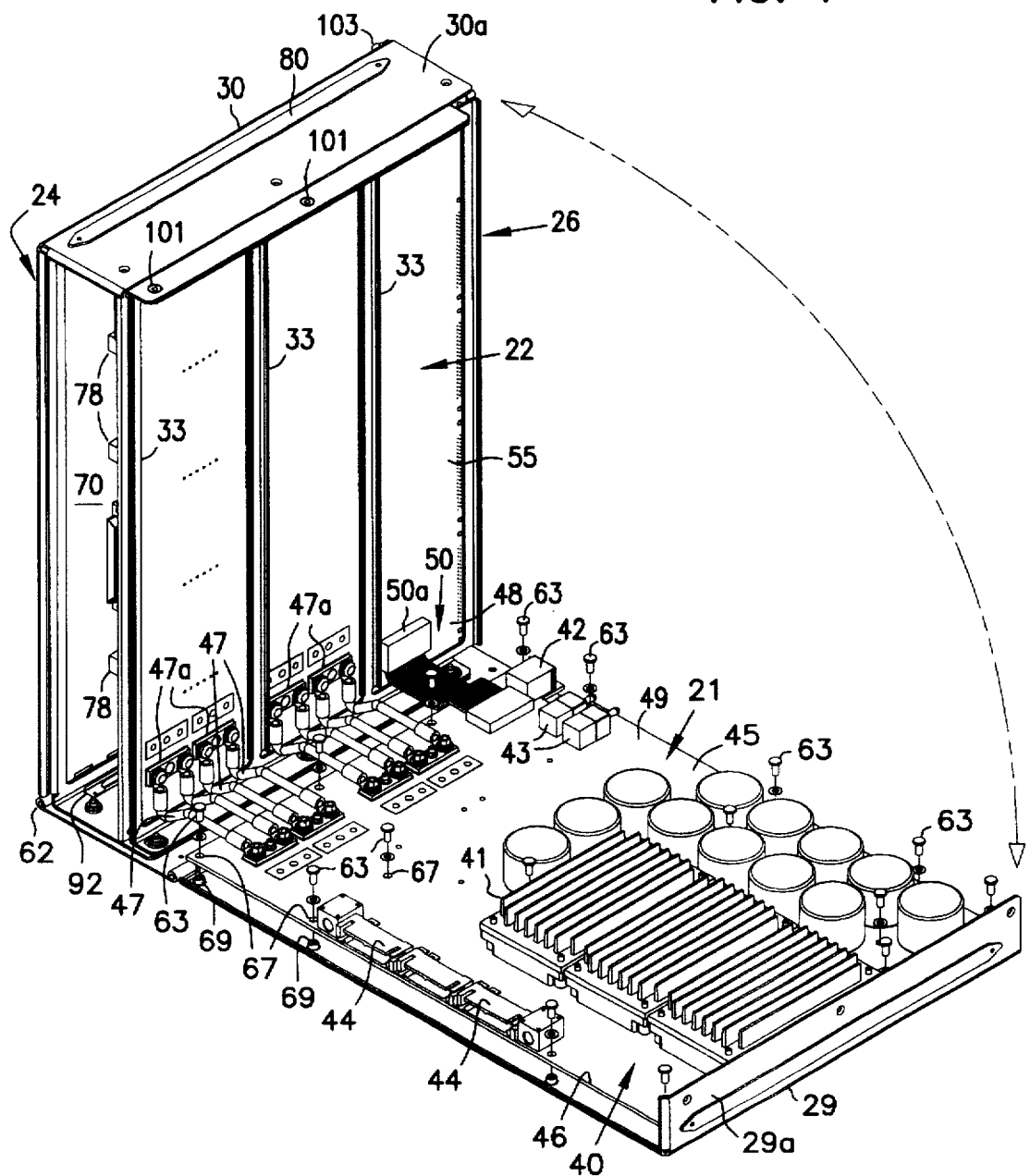
FIG. 7 is a rear perspective view of the input/output module housing of FIG. 6, shown with one side panel dropped to an open position and with the power supply circuit board mounted on the side panel.
Figure 8:
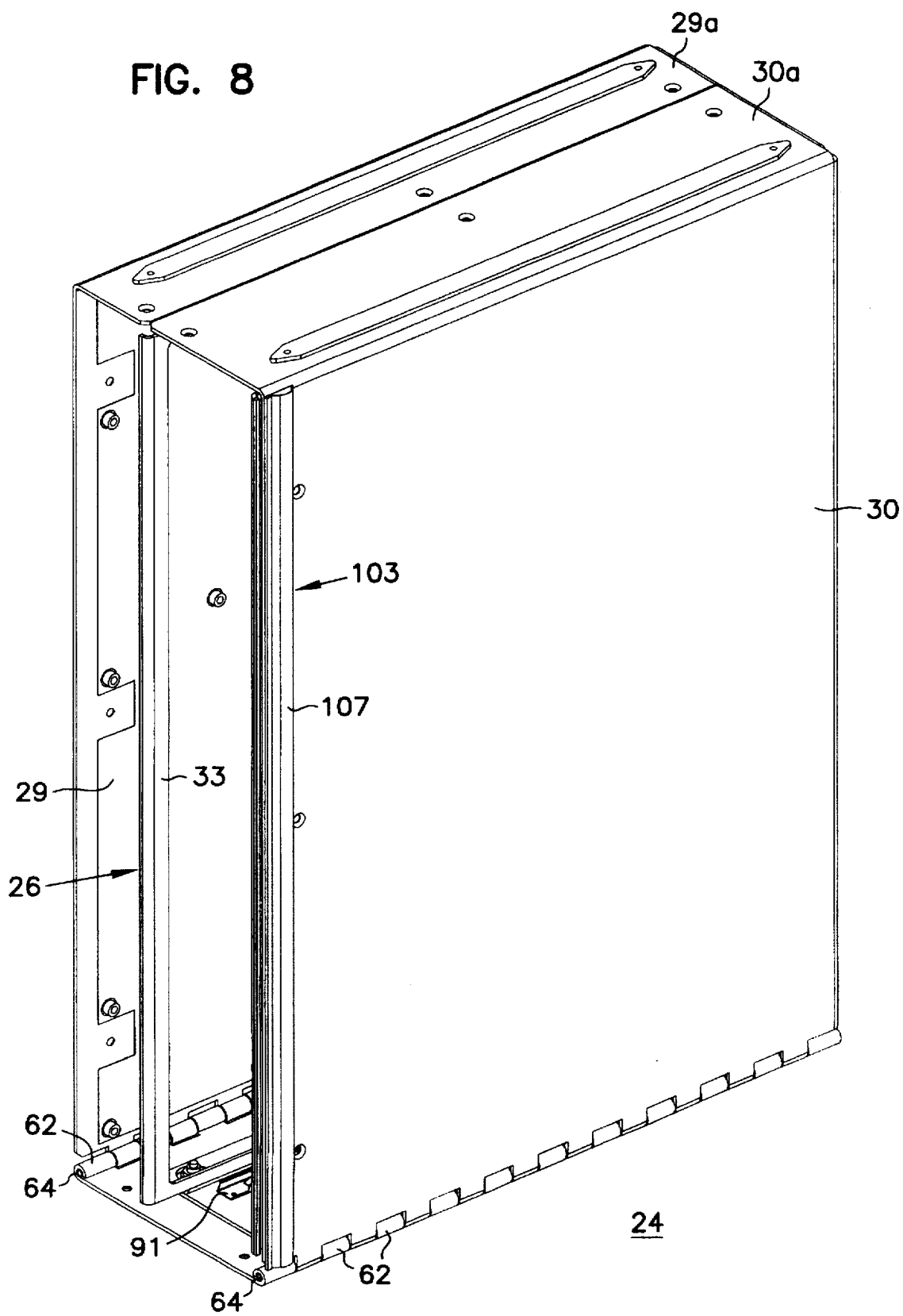
FIG. 8 is a rear perspective view of the housing of the input/output module of FIG. 5.

Referring to FIGS. 5–8 and 10, the enclosure 24 is a sheet metal structure including a frame 26, a top member 27, a bottom member 28, a drop-down side panel 29, a drop-down side panel 30, and a removable bulkhead cover panel 31, enclosing the outer end of the enclosure 24. The frame includes left and right frame portions each formed by four upright members 33 which are interconnected at their tops and bottoms by respective horizontal members 33a and 33b. The frame 26 is secured to the bottom member 28 by screws 39. The bottom member 28 includes circuit board guides 91 and 92 (FIG. 10) for guiding the peripheral interface assembly and the peripheral specific channel adapter assembly into the housing during assembly of the input/output module. The left and right panels are hinged to the lower portion of the frame by 62 and hinge pins 64 and are movable between a closed position, shown in FIGS. 5 and 6, forming a closed bulkhead within which the circuit board assemblies 21–23 are enclosed, and an open position, wherein one or both of the two side panels 29 and 30, such as side panel 29, is dropped down, as shown in FIG. 7, for providing access to the back or non-component sides of the circuit board assemblies. The right and left side panels 29 and 30 are each L-shaped members having a rectangular side the free end of which is bent over at a 90° angle, defining panel portions 29a and 30a which wrap around the top member 27 when the side panels are in the closed condition. The length of the two panel portions is selected so that the ends of the panel portions 29a and 30a abut one another as is illustrated in FIGS. 6 and 8. The cover panel 31 has side lugs 35 (FIG. 5) along each side edge, and includes a removable access plate 37. The cover panel includes pass through openings 32 and 36 for connectors on circuit boards of the circuit assemblies. In addition, the access plate of the cover has perforations 38 for exhausting cooling air from the enclosure. The cover panel 31 is attached to the frame in suitable manner, such as by screws 95 (FIG. 5) which pass through openings 97 in the side panels and are received in tapped openings 98 in the side lugs 35. In an exemplary embodiment of the input/output modules, such as input/output module 10a, that was constructed, the enclosure 24 was 14.875 inches high, 4.20 inches wide and 10.625 inches deep. The cover panel 31 was 15.81 inches high, 4.25 inches wide, and 0.100 inch thick.

Referring to FIGS. 5–7, the power supply assembly 21 receives single phase voltage at 208–230 VAC from the subrack and converts this power to the channel specific D.C. voltage requirements. The power supply assembly 21 includes an AC to DC converter module, indicated generally at 40, and associated circuit components which are mounted on a printed circuit board 45. The converter module 40 include finned heat sinks 41. The AC-DC module 40 provides conversion of the 208–230 VAC subrack voltage to 300 VDC and convert the 300 VDC to channel specific voltages. The power supply board is configurable such that it can supply up to four D.C. voltage levels or magnitudes for each specific channel adapted design by the selection of D.C. converters installed on the printed circuit board 45.

The power supply assembly 21 provides remote monitoring and maintenance access to the channel via serial test port 42, such as an RS232 port. Reset and voltage margining switches 43, which are mounted on the outer edge 49 of the printed circuit board 45, provide for adjustment, test, and debugging of the circuits of the power supply assembly. The power supply includes potentiometers which permit adjustment in the voltage levels produced by the DC-DC converters. The edge mounted components are accessible through the removable access plate 37 on the cover panel 31 (FIG. 6) which is secured to the cover panel by suitable hardware, such as quick release screws 104.

The power supply assembly 21 is adapted to be mounted on the hinged side panel 29 of the frame 24 and secured thereto by suitable mounting hardware 63 (FIG.5) which passes through apertures 67 in the circuit board 45 and are received in tapped apertures 69 in the side panel 29. The power supply assembly interfaces to the subrack via three male printed circuit board mount, right angle, connectors 44 which are located along the inner edge 46 of the printed circuit board 45 to receive input voltage at 208–230 VAC from the subrack and to provide interconnections between the subrack and sensing devices on the power supply circuit board 45 which enable monitoring voltage and temperature for the input/output module. By way of example, the input A.C. power and sensing device connections can be provided by three Positronics "POWR-LOK" modules containing six contacts which mates to a connector mounted on the inner wall 34 of the subrack card cage. The D.C. voltages produced by the power supply assembly are applied to the peripheral interface assembly 22 by bus straps, indicated generally at 47, and bus bars, indicated generally at 47a, in FIG. 7, which are attached to the circuit board 45 near the bottom edge 48 thereof. Signal lines between the power supply assembly and the peripheral interface assembly 22 are interconnected via a ribbon cable header and a DIP socket, indicated generally at 50.

In one exemplary embodiment, the power supply assembly was 14.35 inches high, 10.157 inches wide and had a 1.10 maximum component/heat sink skyline ratio. The thickness of the printed circuit board 45 was 0.093 inch.

Figure 11:
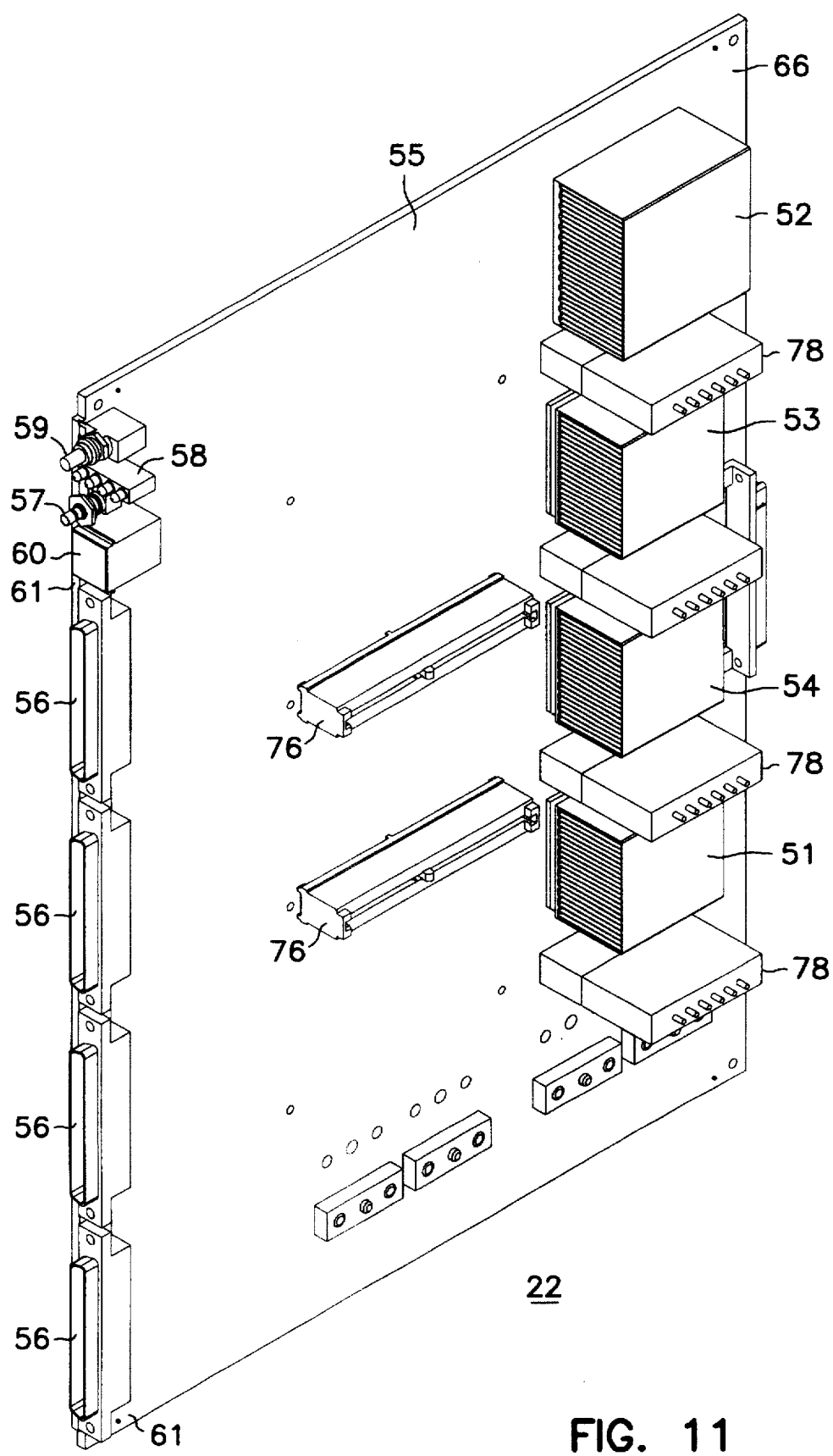
FIG. 11 is a perspective view showing the component side of a peripheral interface circuit board assembly of the input/output module of FIG. 5.

Referring to FIGS. 5, 6 and 11, the peripheral interface assembly 22 provides the common system connection, input/output digital signal processing, general support logic, and the power distribution required by all peripheral channel types. A logical and physical division is made between functions that are channel specific or generic to all assemblies. The peripheral interface assembly 22 physically provides for the connectivity with the peripheral channel through four connectors 56 that are mounted on the outer edge 61 of the printed circuit board 55 of the peripheral interface assembly 22. By way of example, the peripheral ports can be provided by four Bellows 80 I/O style connectors. The peripheral interface assembly 22 hosts the peripheral interface logic.

More specifically, in one exemplary embodiment, the peripheral interface assembly 22 includes a microprocessor 51, such as a 100 MHz CPU (I/O processor) having an associated I/O processor, and associated memory providing 8 or 16 MegaBytes of DRAM memory. The microprocessor 51 generates a 100 MHz clock for channel specific applications. However, in other embodiments, other microprocessors can be employed, and memories providing storage for more or less than 8 or 16 MegaBytes can be used as a function of application.

The peripheral interface assembly 22 further includes three application specific integrated circuits 52–54 which, together with the microprocessor and associated elements, are mounted on the circuit board 55 near the inner edge 66 thereof. The circuit 52 functions as the peripheral node chip providing channel support logic for interfacing to the channel specific assembly. The circuit 53 provides maintenance and test access interfaces and is accessible by way of a 10 base T Ethernet maintenance port having an associated connector 60. The circuit 54 functions as a client serial interface for supporting up to five peripheral channels. The connector 60, which can be an eight wire RJ45 Ethernet connector, is mounted on the outer or bulkhead edge 61 of the printed circuit board 55.

The ribbon connector 50 (FIG. 7), which provides for signal interconnection between the power supply assembly 21 and the peripheral interface assembly 22, is received in a DIP socket, indicated generally at 50a, which is mounted on the back or non-component side of the circuit board 55. The bus straps 47, by which power is extended from the power supply assembly 21 to the peripheral interface assembly 22, are connected to edge connectors (FIG. 7) and are terminated at bus bars 47a which are mounted on the non-component side of the circuit board 55. Other components that are mounted on the outer edge 61 of the circuit board 55 include a connector 57, four status indicators 58, and a dual position momentary reset switch 59. The connector 57 provides access to the clock signal generated by the peripheral interface assembly 22. The status indicators 58 indicate status of software programs being run by the microprocessor 51. The reset switch 59 provides a hard/soft reset function for the microprocessor.

In one exemplary embodiment, the peripheral interface assembly 22 was 14.59 inches high, 10.50 inches wide and 1.375 inches in height, measured from the board component surface 68. The thickness of the printed circuit board 55 was 0.108 inch.

Figure 12:
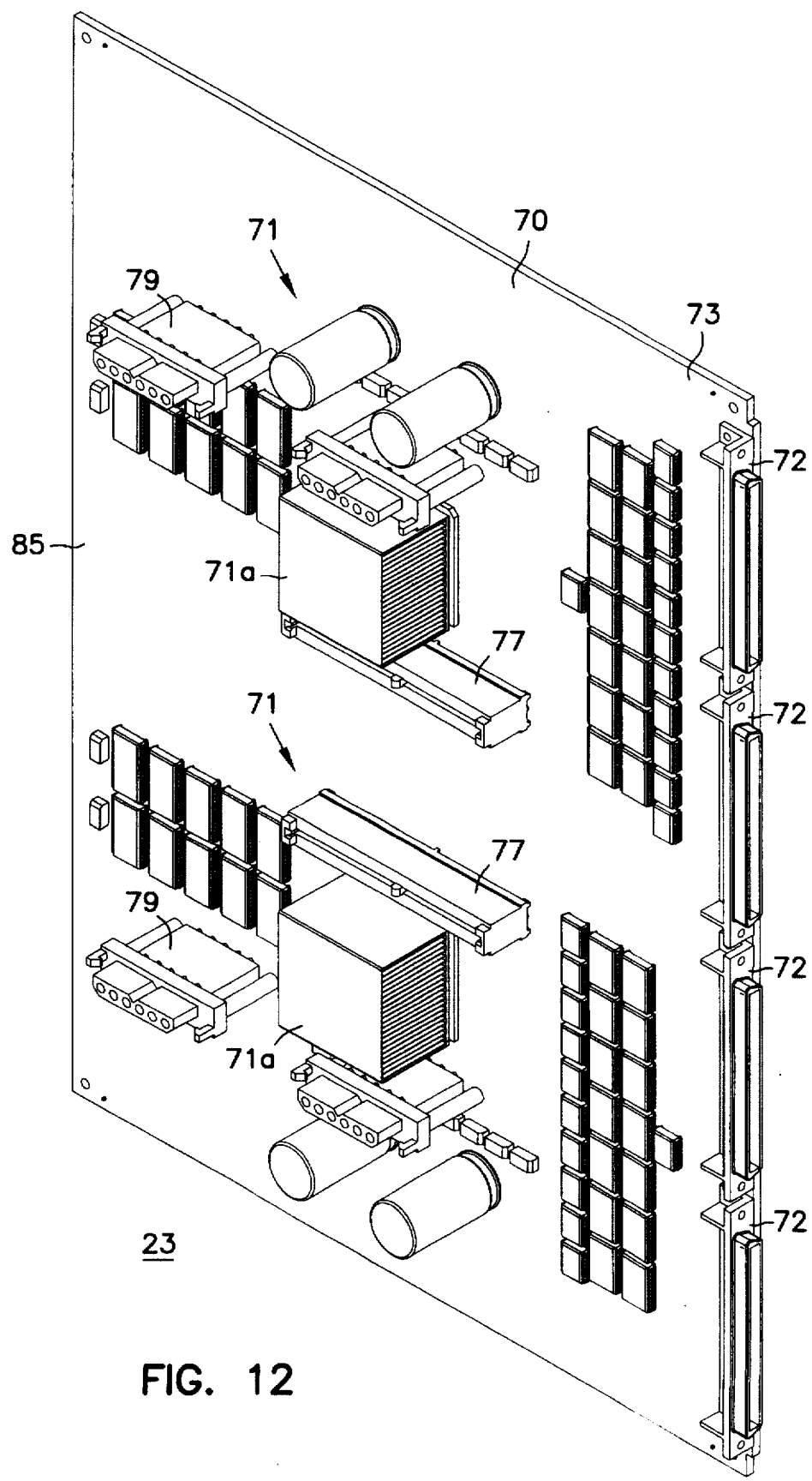
FIG. 12 is a perspective view showing the component side of a peripheral channel adapter circuit board assembly of the input/output module of FIG. 5.

Referring to FIGS. 5, 6 and 12, the peripheral specific channel adapter assembly 23 includes a printed circuit board 70 having mounted thereon up to five application specific integrated circuits, two of which are shown as indicated at 71. The circuits 71 are located spaced inwardly from the inner edge 85 of the circuit board 70 and include portions 71a that extend outwardly from the surface of the circuit board 70. The circuits 71 provide for logic control and I/O buffer memory physical interface components for up to five independent peripheral channels, with 128K×64 of 400 MB/Sec I/O buffer per channel. In addition, the peripheral specific channel adapter assembly 23 provides the necessary logic and power interfacing to the circuit board of the peripheral interface assembly 22.

Up to five peripheral interface connectors 72, which are mounted on the outer or bulkhead edge 73 of the printed circuit board 70, provide the required input/output connections to the various channel types. By way of example, the peripheral interface can employ microminiature "D" 51 connectors or other application specific connector interfaces dependent on the function of the input/output module. The maximum number of interfaces for each peripheral is five, but a lesser number of connectors can be used depending upon application. Examples of peripheral channel types which the input/output modules 10a–10d can be used to interface include:

a. IPI Disk type channel which provides a maximum of five channels, and uses five microminiature "D"-type connectors;

b. Fiber Channel Disk which provides a maximum of five channels and uses five subminiature "D"-type connectors;

c. a signal combining device, such as an FIPS-60, or a block multiplexer, for combining information provided on two channels and which uses four microminiature "D"-type connectors;

d. parallel HIPPI type channel which provides two channels and uses four high density "D"-type connectors; and e. an ESCON type channel which provides two channels and uses two RSD fiber optic connectors.

Physical partitioning of functionality allows for this assembly to connect through the cover panel 31 for the peripheral connections. In one exemplary embodiment, the specific channel adapter assembly was 14.59 inches high, 10.50 inches wide and 1.25 inches in height, measured from component surface of the printed circuit board. The thickness of the printed circuit board was 0.108 inch.

Referring to FIGS. 5, 11, 12 and 14, in accordance with a further aspect of the invention, the peripheral interface assembly 22, which is generic to all of the channels, and the peripheral specific channel adapter assembly 23, which is channel specific, are adapted to be mated together with their component bearing surfaces extending in parallel opposing relation with one another, forming a composite circuit board assembly that is channel specific. These two assemblies are interconnected electrically and mechanically by connector systems. In addition, the peripheral specific channel adapter assembly 23 receives D.C. power from the interface assembly 22. Additional D.C. voltage level requirements for any channel are produced on the circuit board of the peripheral specific channel adapter assembly 23 with DC-DC converters.

Figure 13:
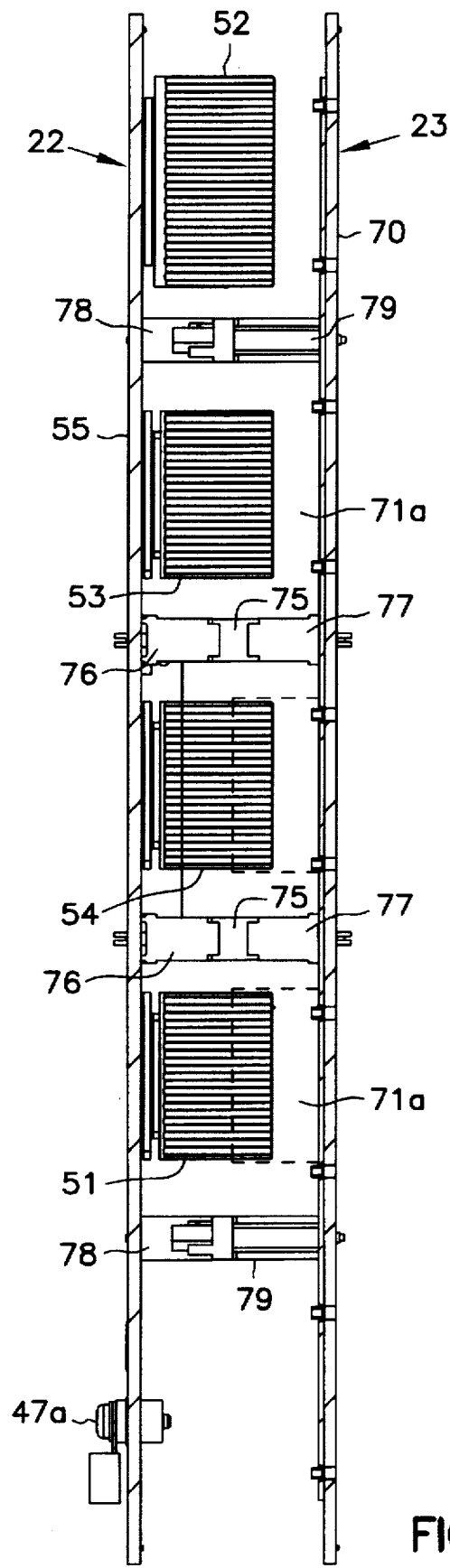
FIG. 13 is a sectional view taken along the line 13—13 of FIG. 5 and showing the skylining of the components of the peripheral interface circuit board assembly of the input/output module.
Figure 14:
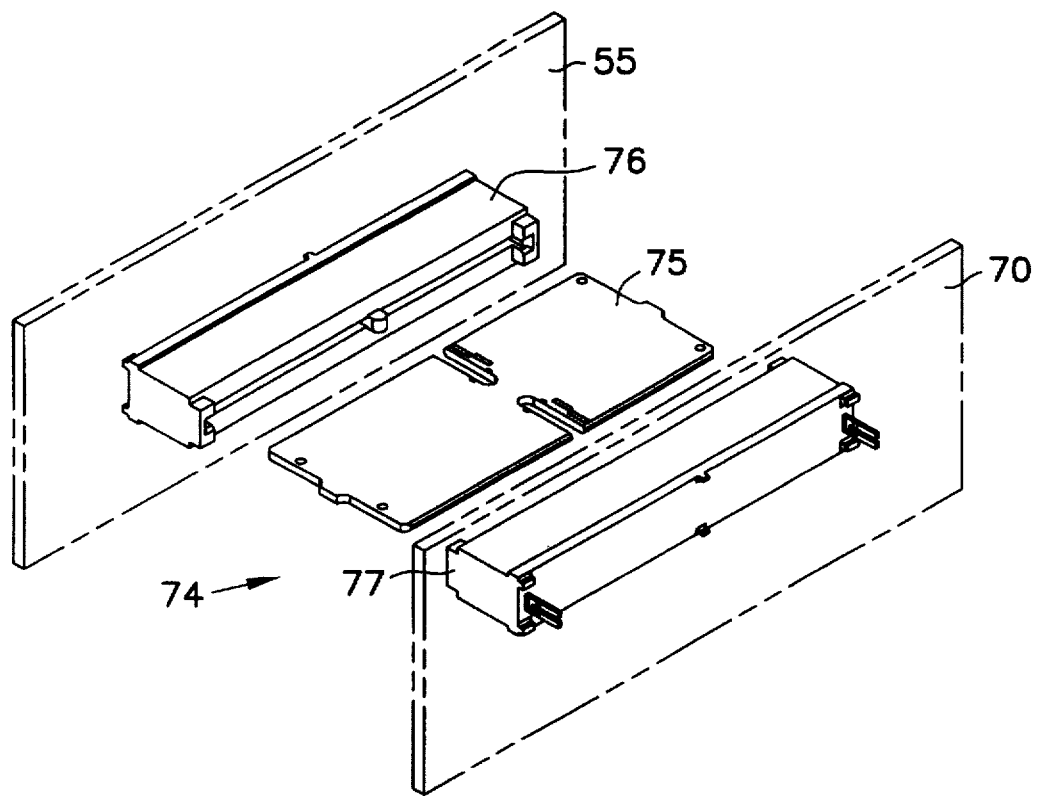
FIG. 14 is a fragmentary view illustrating one of the interboard connectors of the input/output module assembly of FIG. 5.

More specifically, the signal interconnections between the peripheral interface assembly 22 and peripheral specific channel assembly 23 are accomplished by connector assemblies 74, shown in FIGS. 5 and 14, each including a board/edge connector arrangement which includes two "z-axis" connector planar cards 75 which extend perpendicular to the printed circuit boards and are received in two extended length connector sockets 76 on the circuit board 55 of the peripheral interface assembly 22 and two extended length connectors 77 on the circuit board 70 of the peripheral specific channel adapter assembly 22. The connector sockets 76 and 77 are mounted on the opposing component bearing surfaces of the two circuit boards 55 and 70. Due to the component heights, and in particular the heights of the heat sinks, and the overall board separation distance, the components 51–55 of the peripheral interface assembly 22, are skylined as shown in FIG. 13, with the components 71a of the peripheral specific channel adapter assembly 23 and the heat sinks associated therewith, and conversely, the components of the peripheral specific channel adapter 23 are skylined with the components of the peripheral interface assembly 22. When the circuit boards are mated, the vertical spacing of the component sides of the circuit boards is 1.70 inches in one exemplary embodiment.

Power connections between the peripheral interface assembly 22 and the peripheral specific channel adapter assembly 23 are accomplished by a power supply connector assembly that includes vertical mating sandwich connectors 78 and 79 which are mounted on the printed circuit boards 55 and 70, respectively. As has been indicated, D.C. power is supplied to the peripheral interface assembly 22 from the power supply assembly 21 via the bus straps 47 and bus bars 47a (FIG. 7).

Figure 10:
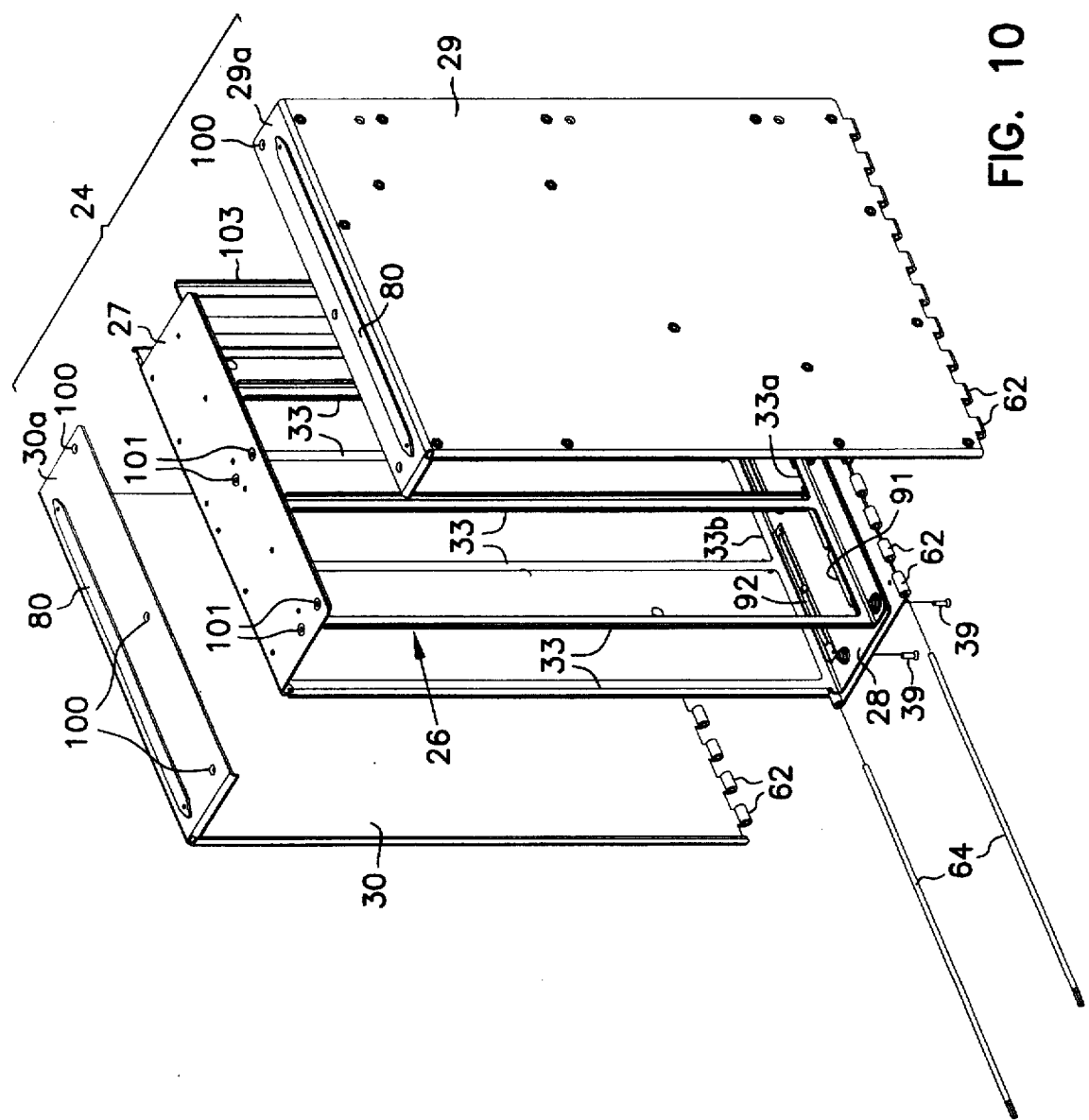
FIG. 10 is an exploded perspective view of the input/output module housing of FIG. 8.

Referring now to FIGS. 5, 7, 11 and 12, to assemble the input/output module 10a, the power supply assembly 21 is mounted on the side panel by mounting hardware 63. The printed circuit board 70 of the peripheral specific channel adapter assembly 23 is mated to the printed circuit board 55 of the peripheral interface assembly 22, by inserting the connector cards 75 into one of the connector sockets 76, for example. Then, the circuit boards 55 and 70 are positioned with their component bearing surfaces in opposition and with the connector cards 75 aligned with the other connector sockets 77, and with the power connectors 78 aligned with power connectors 79, the mating connectors are moved into engagement by pressing the two circuit boards together. Then, the thus assembled circuit boards are inserted into the enclosure 24 and guided into position by the circuit board guides 91 and 92, with the circuit board 55 being located in guide 91 (which is shown FIG. 10) and the circuit board 70 being located in guide 92 (FIG. 10). The mated circuit boards 55 and 70 of the peripheral interface assembly 22 and the peripheral specific channel assembly 23 are installed simultaneously into the enclosure 24. When the circuit boards are fully inserted into the enclosure, connectors 44 and 56 are position to extend through the connector openings 32 and 36 in the cover panel 31 which is installed on the enclosure 24 after the assemblies 21, 22 and 23 have been installed in the housing. Connections can be made between the power supply assembly and the peripheral interface assembly 22 by the bus straps 47 and bus bars 47a (FIG. 7) before folding up the side panel 29 which mounts the power supply assembly.

Then, the side panel 29 is folded up to engage the frame in overlying relation with the non-component side of the circuit board 55 and with the panel portion 29a overlying a portion of the top member 27. The side panel 30 is folded up to engage the frame in overlying relation with the non-component bear surface of the circuit board 70 and with panel portion 30a overlying the remaining portion of top member and abutting the edge of panel portion 29a. Alternatively, the side panel 30 can be folded up prior to inserting the circuit boards into the enclosure, or as soon as the circuit board are positioned within the enclosure 24. The side panels 29 and 30 are secured to the frame 26 by panel screws 99 which pass through openings 100 in the panel portions 29a and 30a of the side panels and are received in tapped openings 101 (FIG. 10) in the top member 27.

Then, the cover panel 31 is mounted on the frame 24 and secured to the frame and the side panels 29 and 30 by side panel screws 95 which pass through openings 97 in the side panels and are received in tapped openings 98 in the side lugs 35 (FIG. 5). When, the cover panel 31 is mounted on the frame 24, the connectors 56 and 72 extend through respective connector openings 32 and 36 in the cover panel 31. The mated circuit boards 55 and 70 of the peripheral interface assembly 22 and the peripheral specific channel assembly 23 are installed simultaneously into the enclosure 24. The bulkhead located connectors 56, 60 and 72 which protrude through the cut-outs 32, 82 and 36 in the cover panel 31 are manually connected to the cover panel 31 using connector jack posts 87.

Maintenance connections to the RS232 port 42, and the voltage margining switches 43 of the power supply assembly 21 are located behind the removable access plate 37 on the cover panel 31 when the peripheral interface assembly 22 and the peripheral specific channel adapter assembly 23 are enclosed within the enclosure. Each channel type has a specific cover panel 31 that is cut out to meet specific connection requirements.

Referring to FIG. 5, after assembly of the interconnected assemblies and mounting of the circuit board assemblies in the card cage, access to the circuit boards of a each input/output module is achieved by removing the side panel screws 99 and detaching the cover plate 31, and then removing the appropriate ones of the screws 95 so that one or both of the hinged side panels 29 and 30 can be pivoted downwardly about the hinge pins 64 at their lower edges. The power supply assembly 21, which is directly attached to the hinged side panel 29, drops away from the card cage frame 26 as the enclosure is opened. With the side panels opened, access is gained to the channel card cage and to the non-component sides of the circuit board 55 of the peripheral interface assembly 22 and the circuit board 70 of the peripheral specific channel adapter assembly 23.

Referring to FIGS. 1, 2 and 6, the input/output modules 10a–10d are adapted to be inserted into the subrack assembly 11 and guided to the rack and panel connector (not shown) of the subrack by nylon guide strips 80 mounted on the top and bottom of the frame, which cooperate with nylon guide strips 82 on the upper surface of the bottom member 17 and the lower surface of the rearward top plate 13 b of the subrack housing 12. Final alignment and mating of the rack and pin type connectors 44 of the power supply assembly 21 is achieved by tapered guide pins and alignment holes, indicated generally at 88 in FIG. 2, at the rear of the housing 12 for the input A.C. power and monitoring connector interfaces 44 which are blind mated in the manner known in the art.

When the input/output modules are installed in the card receiving cage portion 18 of the housing 12, the components on the printed circuit board 55 of the peripheral interface assembly 22 are located at the rearmost portion of the card receiving portion of the housing. The application specific integrated circuits 52–54 of the peripheral interface assembly 22 have a maximum thermal dissipation of twenty-three watts and are mounted at the inner edge 66 of the circuit board 55 in order to receive "first-in-flow" cooling air from the blower 20 mounted in the plenum 19 of the subrack housing. The components 71 on the printed circuit board 70 of the peripheral specific channel adapter assembly 23 are mounted spaced inwardly from the inner edge 85 of the circuit board 70, and of the inner edge of the peripheral interface assembly 22, so that the components are located forwardly of and skylined with the components 51–54 of the peripheral interface assembly 22. The components on the circuit board 70 receive "second in air flow path" cooling air from the subrack blower 20. That is, the cooling air that is provided to the components of the peripheral specific channel adapter assembly 23 first passes over the components of the peripheral interface assembly 22, providing cooling for those components. This results in a small increase in the temperature of the cooling air that reaches the components on the circuit board 70. The temperature increase in the cooling air is dependent on the air flow rate and on the thermal dissipation capabilities of the circuit components being cooled.

All power consuming components of the input/output modules 10a–10d are cooled by ambient air that is supplied from the subrack and passed over heat sinks mounted to each power device. Cooling air is exhausted partially through connector cutout openings 32 and 36 in the panel 31 and the perforations 38 in; the panel and in the access plate 37. The peripheral specific channel adapters and gateways are cooled by forced air delivered from the subrack. The subrack blower 20 in the plenum 19, located forwardly of the input/output modules 10a–10d, can deliver up to 170 cubic feet per minute of air to each peripheral specific channel adapter dependent on the air flow resistance of each input/output module. The supplied air to each input/output module is divided to supply air to both the power supply assembly and the mated peripheral interface assembly 22 and peripheral specific channel adapter assembly 23.

Figure 15:
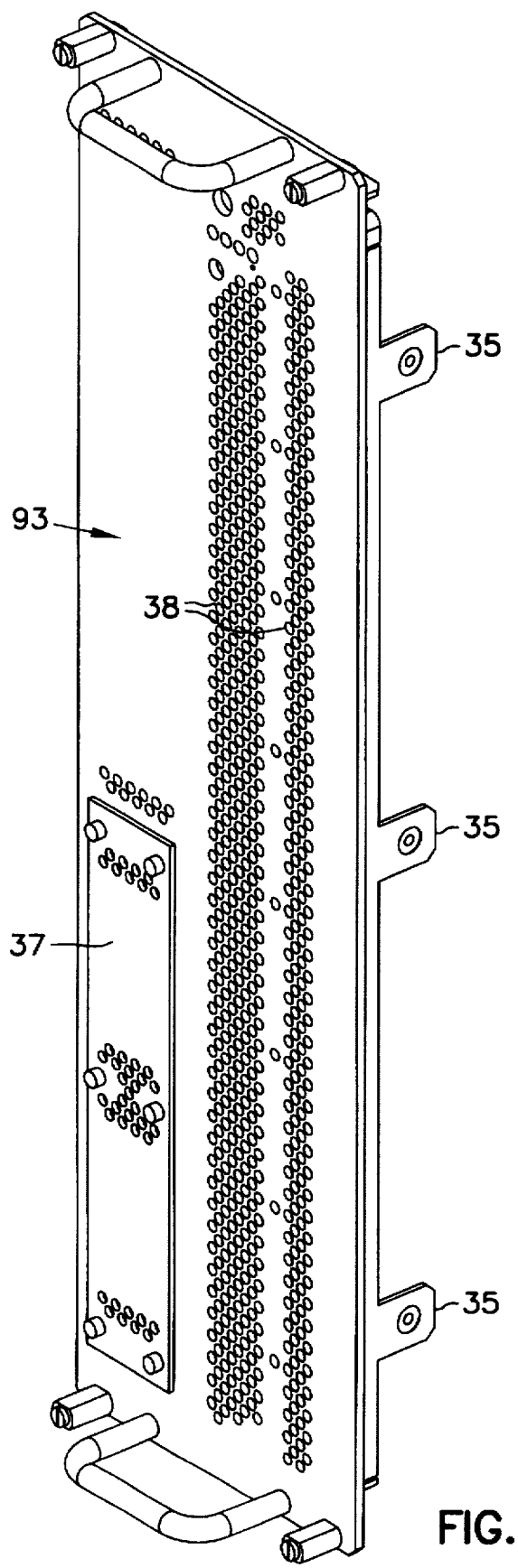
FIG. 15 is a front view of an air flow restrictor for use with the input/output module assembly of FIG. 1.
Figure 16:
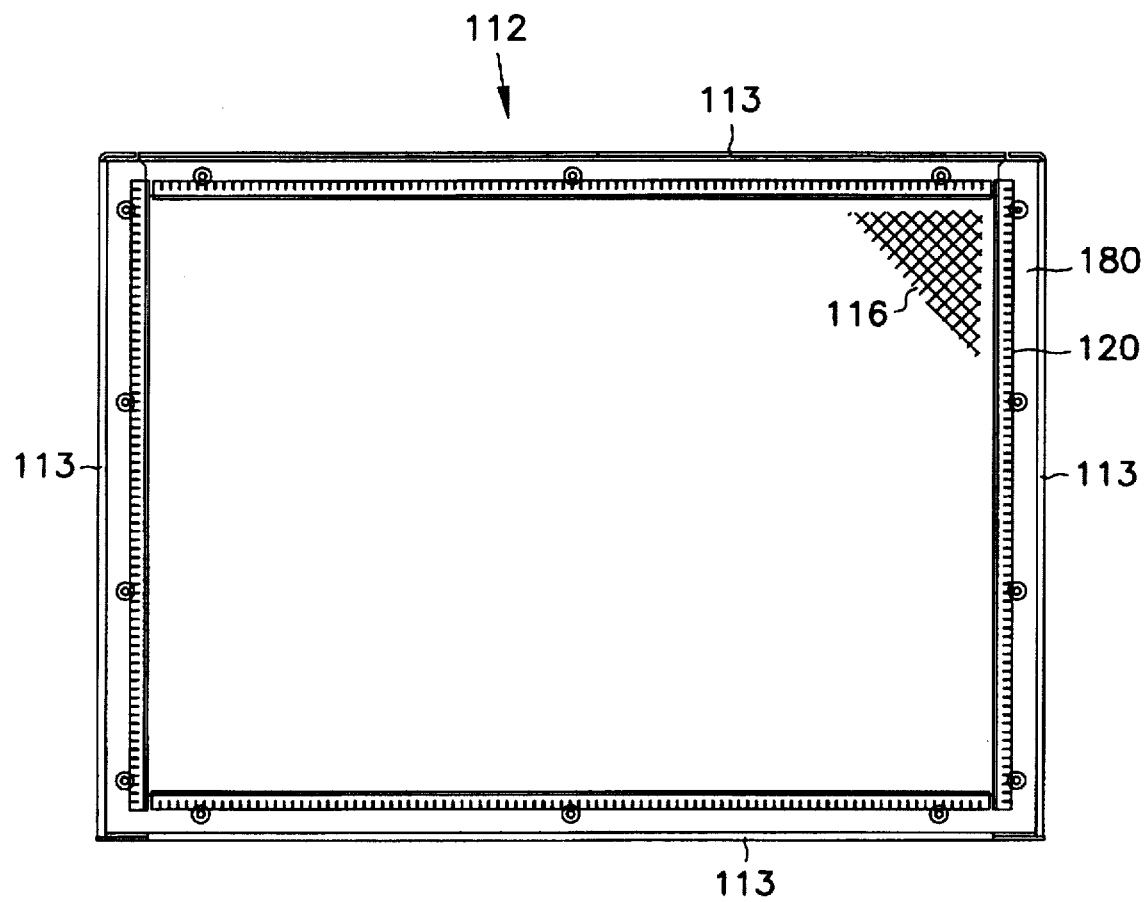
FIG. 16 is a front view of the EMI screen of the subrack assembly.

Cooling air is exhausted through the cover panel 31 which has the connector cutouts 32 and 36 and ventilation perforations 38. Empty module slots in the subrack have suitable cover panel air flow restrictors 93 shown in FIG. 15, which are installed in those locations. The air flow restrictors are essentially modified module cover panels that do not have connector cutouts and are not attached to the other parts of a module enclosure. These panels include perforations 38 in the same fashion as the cover panels 31 that are used on the module enclosures, with the hole pattern extending through the area normally containing the connector cutouts.

The maximum channel dissipation is 400 Watts at the environmental limits of 32° C. and at an elevation of 2,000 meters. The maximum power budget is 125 watts maximum for the power supply assembly and 275 watts maximum for the two assemblies 22 and 23 which provide the channel specific functions. As can be seen in FIG. 5, the separation or opening 84 between opposing surfaces of the two circuit boards 55 and 70 that form the channel specific circuit is greater than the separation or opening 86 between the side panel 29 of the enclosure 24 and the surface of the circuit board 45 of the power supply assembly 21 to provide for the increased air flow around the peripheral interface assembly 22 and the peripheral channel adapter assembly 23 which form the channel specific circuits of the input/output module. Stated in another way, the volume of cooling air supplied to the two circuit boards 55 and 70 that form the channel specific circuit is greater than the volume of cooling air flow supplied to the power supply assembly 21. This spacial arrangement is provided for each of the input/output modules contained within the subrack housing 12.

The maximum operating frequency for any input/output module is 150 MHz. Accordingly, to minimize the effects of electromagnetic radiation and radio-frequency radiation, the subrack housing 12 includes metallic shield forming bulkheads, a shield panel mounted within the subrack housing, enclosing the open back portion of the housing, and metallic seal members or gaskets, all of which provide attenuation of the effects of electromagnetic and radio frequency interference by creating an EMI tight housing for the circuits of the input/output modules.

More specifically, with reference to FIGS. 1, 5, 8 and 9, the components of the enclosure 24 for each of the input/output modules 10a–10d, including the frame 26, the top member 27, the bottom member 28, the cover panel 31 and the side panels 29, 30, are made of aluminum. In addition, each enclosure 24 includes a resilient, metallic seal member 103, embodied as a beryllium copper finger gasket, that extends along the outer side edge of the enclosure side panel 30 for providing sealing between adjacent input/output modules and the subrack housing. A further resilient seal member 104, which can be made of beryllium copper, extends along the inside edge for providing sealing between the enclosure 24 and the module cover panels 31.

Figure 9:
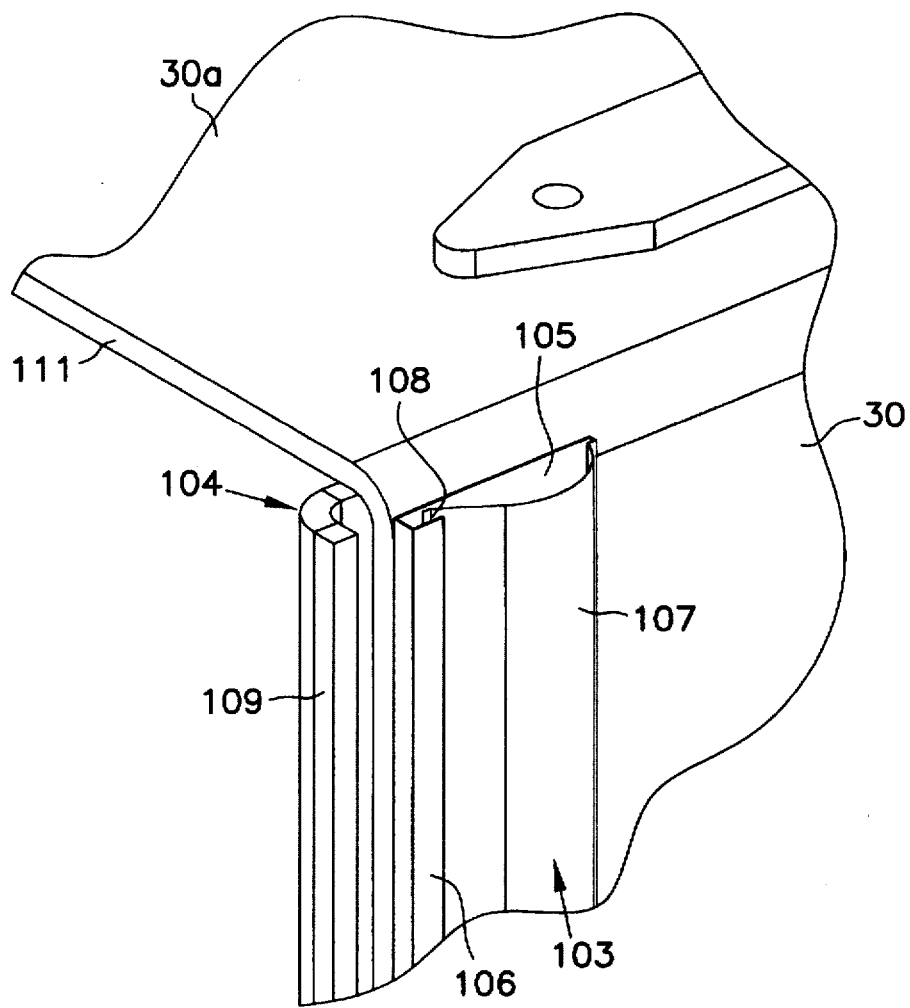
FIG. 9 is an enlarged fragmentary view illustrating one of the finger gaskets provided on the housing of the input/output module of FIG. 5, for providing EMI isolation between outer ends of the input/output modules at the rear of the subrack assembly.

Referring to FIG. 9, the finger gasket 103 includes a flat mounting portion 105 that is folded back at the outer edge defining a channel 106. The resilient sealing portion of the gasket 103 is defined by a curved portion 107 that extends in cantilever form from the inner edge of the mounting portion 105 towards the outer edge of the mounting portion and bowed outwardly away from the surface of the side panel 30. The free edge 108 of the curved portion 107 is located within the channel 106. The sealing member 104 extends along the inner surface of the side panel 30 with its outer edge 109 bent over to be captured between the cover plate 31 and the outer edge 110 of the side panel 30 when the cover plate 31 is mounted on the enclosure 24.

The aluminum enclosures 24 of the input/output modules 10a–10d form metal bulkheads within the subrack housing 12. The curved portions 107 of the finger gaskets 103 make contact with the rearward right edge of the adjacent input/output module, flexing slightly, for providing isolation along the interface where the two input/output modules meet at the open forward portion of the subrack housing 24. The finger gasket 103 of input/output module 10d engages the outer edge of the sidewall 15 of the subrack housing 12, at the right side as viewed in FIG. 1. Also, the outer left edge of the input/output module 10a makes contact with a finger gasket 103 that is mounted in the subrack channel card cage. The bulkheads for each input/output module, defined by cover panels 31, have perforations to allow for cooling air exhaust and for EMI shielding of the cover panel bulkheads of the input/output modules. As is shown in FIGS. 5 and 6, for example, the cover panels 31 have extension portions 94 that mate to the subrack extensions and are attached thereto with ¼ turn quick release fasteners 96 which pass through openings (not shown) through the extension portions 94 and are received in tapped openings 111 in the bottom 17 of the subrack housing 12 (FIG. 2). Each channel type has a specific cover panel bulkhead cutout to meet EMI and connection requirements.

Referring to FIGS. 1–4 and 16, the subrack assembly 11 includes a shield arrangement for providing an EMI seal and an air seal between the module compartment 18 and the plenum 19 of the sub-rack structure 12. The shield arrangement includes a metallic shield, which is embodied as a screen panel 112, that is mounted within the housing 12 located behind the blower 20 in the exhaust plenum 19, and adjacent to the inner edges of the input/output modules. The screen panel 112 is secured by its edges 113 to a pair of vertical right angle members, such as right angle member 114, and to upper and lower mounting flanges 115 of the subrack structure.

The screen panel 112 is made of multiple layers of wire mesh 116 with approximately 1/16 inch square openings. The layers of wire mesh are sandwiched between two pieces of expanded metal with all of the layers captured in a welded frame 118 of extruded aluminum. All filter material is aluminum that has been chemically treated to prevent corrosion. The frame 118 has a monel wire mesh gasket 120 for providing an EMI seal and a neoprene gasket (not shown) for providing an air seal attached around one face where it interfaces with the right angle members 114 and flanges 115 of the sub-rack structure. A monel wire mesh gasket 122 can also be provided between the upper edge 124 and forward cover portion 13 a and between upper edge 126 and rear cover portion 13 b for providing an EMI seal therebetween as is shown in FIG. 4.

A screen panel is used because it is pervious to air and facilitates supplying of cooling air to the input/output modules while providing shielding from the effects of EMI. Because of its metallic composition, the screen panel defines a barrier to high frequency electrical signals, thereby functioning as a shield for electromagnetic and radio-frequency radiation at the inner side of the input/output modules. The shielding level provided by the screen filter is in excess of 4 gigahertz.

In addition, for any components, such as indicators, which must be located within the plenum the terminals of such components are passed through suitable filter devices, such as ferrite core devices or the like, which act as EMI suppressing filters for minimizing the effects of stray high frequency radiation at the isolation interface defined by the screen panel 112 at the inner edge of the input/output modules 10a–10d. The inner wall 34 of the subrack card cage has openings, such as openings 128 and 130, above and below the edges of the filter 112 that are used for the wire pass throughs.

More specifically, them are three types of EMI/RFI filtering that can be used for wiring into the plenum. One type is a bulkheaded connector 132 mounted in pass through opening 128. Connectors suitable for this purpose are commercially available from Positronics Corporation and have filtering components built into them. This type of arrangement is used for filtering all digital signal wiring that passes into the plenum. Electrical AC power wiring can employ two types of filtering. Electrical AC line filters are placed in close proximity to the wire penetration point, such as openings 130. In conjunction with this, a ferrite bead toroid 134 is mounted at the penetration point where the wire passes into the plenum. Both the bulkheaded connector and the toroid are located outside the EMI/air filter 112.

What we claim is:

1. An input/output module for a digital processing system for coupling input/output devices to a network of said system, said system having a plurality of information channels, said input/output module comprising:

a plurality of circuit board assemblies, wherein each circuit board assembly includes a component bearing surface;

an enclosure for enclosing said circuit board assemblies;

a first one of said plurality of circuit board assemblies including circuits that are application specific to a given one of said plurality of information channels of said system, and a second one of said plurality of circuit board assemblies including circuits that are common to all of said plurality of information channels of said system;

and a connector assembly for electrically interconnecting said first and second circuit board assemblies, wherein the connector assembly includes a first connector mounted perpendicular to the component bearing surface of the first one of said plurality of circuit board assemblies, a second connector mounted perpendicular to the component bearing surface of the second one of said plurality of circuit board assemblies and connection means for electrically connecting the first and second connectors to form a composite circuit board assembly that is application specific to an information channel with which it is used.

2. An input/output module for a digital processing system for coupling input/output devices to a network of said system, said system having a plurality of information channels., said input/output module comprising:

a plurality of circuit board assemblies;

an enclosure for enclosing said circuit board assemblies;

a first one of said plurality of circuit board assemblies including circuits that are application specific to a given one of said plurality of information channels of said system, and a second one of said plurality of circuit board assemblies including circuits that are common to all of said plurality of information channels of said system;

and a connector assembly for electrically interconnecting said first and second circuit board assemblies to provide a composite circuit board assembly that is application specific to an information channel with which it is used;

wherein a third one of said plurality of circuit board assemblies includes power supplying circuits that are configurable to provide a plurality of supply voltages of different magnitudes for said first and second circuit board assemblies as a function of the configuration of the application specific circuits of said first circuit board assembly.

3. The input/output module according to claim 2, including a first power supply connector assembly connected between said second and third circuit board assemblies for connecting said supply voltages to said second circuit board assembly, and a second power supply connector connected between said first and second circuit board assemblies for extending said supply voltages from said second circuit board assembly to said first circuit board assembly.

4. An input/output module for a digital processing system for coupling input/output devices to a network of said system, said system having a plurality of information channels, said input/output module comprising:

a plurality of circuit board assemblies;

an enclosure for enclosing said circuit board assemblies;

a first one of said plurality of circuit board assemblies including circuits that are application specific to a given one of said plurality of information channels of said system, and a second one of said plurality of circuit board assemblies including circuits that are common to all of said plurality of information channels of said system;

and a connector assembly for electrically interconnecting said first and second circuit board assemblies to provide a composite circuit board assembly that is application specific to an information channel with which it is used;

wherein said first and second circuit board assemblies have component bearing surfaces, said first circuit board assembly being adapted to be mounted on said second circuit board assembly with the component bearing surface of said first circuit board assembly opposing the component bearing surface of said second circuit board assembly and with components of said first and second circuit board assemblies being skylined with one another.

5. The input/output module according to claim 4, wherein said connector assembly includes at least one planar connector element extending between and perpendicular to said component bearing surfaces of said first and second circuit board assemblies, said connector element having first and second ends, a first connector element receiving socket on said component bearing surface of first circuit board assembly for receiving said first end of said connector element, and a second connector element receiving socket on said component bearing surface of second circuit board assembly for receiving said second end of said connector element.

6. The input/output module according to claim 5, wherein said connector assembly includes a plurality of planar connector elements and a corresponding plurality of pairs of connector element receiving sockets on said component bearing surfaces of said first and second circuit board assemblies.

7. The input/output module according to claim 2, wherein said enclosure has a top, a bottom, and a closed end, and first and second sides, and wherein said first and second sides include respective first and second side panels that are hinged to said enclosure at opposite sides thereof, said first and second side panels being movable between a closed position in which said circuit board assemblies are enclosed within said enclosure and an open position in which access is provided to said circuit board assemblies.

8. The input/output module according to claim 7, wherein said third circuit board assembly is mounted on one of said side panels and is movable therewith between said closed and open positions.

9. An input/output module for a digital processing system for coupling input/output devices to a network of said system, said system having a plurality of information channels, said input/output module comprising:

a plurality of circuit board assemblies;

an enclosure for enclosing said circuit board assemblies;

a first one of said plurality of circuit board assemblies including circuits that are application specific to a given one of said plurality of information channels of said system, and a second one of said plurality of circuit board assemblies including circuits that are common to all of said plurality of information channels of said system;

and a connector assembly for electrically interconnecting said first and second circuit board assemblies to provide a composite circuit board assembly that is application specific to an information channel with which it is used;

wherein said first and second circuit board assemblies include electrical signal connectors connected to circuits of said first and second circuit board assemblies, and wherein said closed end of said enclosure is defined by a removable cover panel having openings therethrough, said electrical signal connectors extending through said openings in said cover panel.

10. An enclosure for a plurality of circuit board assemblies, comprising;

a frame for supporting said circuit board assemblies, said frame having a top and a bottom, said frame being open at one end and at first and second sides;

a cover panel mounted on said one end of said frame for closing said frame at said one end thereof;

a first side panel hinged to said frame at said first side thereof;

and a second side panel hinged to said frame at said second side thereof;

said first and second side panels being movable individually between a closed position in which said circuit board assemblies are enclosed within said enclosure and an open position in which access is provided to at least one of said circuit board assemblies from the side of said enclosure wherein said first side panel includes means for mounting one of said plurality of circuit board assemblies to said first side panel such that the circuit board assembly will swing out with the first side panel when the first side panel is moved into an open portion.

11. The enclosure according to claim 10, wherein said frame, said cover panel and said first and second side panels are made of metal, defining a shield against electromagnetic interference radiated from circuit board assemblies contained within said enclosure.

12. An assembly comprising:

a plurality of input/output modules, each of said input/output modules including a plurality of circuit board assemblies, and each of said input/output modules including an enclosure for enclosing said circuit board assemblies, said enclosure having a top, a bottom, a closed outer end, an inner end, and first and second sides;

a housing made of metal and being adapted to receive said plurality of input/output modules in side-by-side relation, said housing enclosing said plurality of input/output modules at least on the top, the bottom, the front, and first and second sides thereof, said housing having an inner chamber adjacent to said inner ends of said input/output modules;

the enclosure for each of said input/output modules being made of metal, whereby the enclosures for said plurality of input/output modules define metal bulkheads within said metal housing for said circuit board assemblies of the input/output modules enclosed within said housing;

and a metallic shield mounted within said housing, interposed between said input/output modules and said inner chamber, said metallic shield substantially preventing radiation of high frequency electrical signals from the interior of said housing through said inner chamber.

13. The assembly according to claim 12, wherein a first one of said circuit board assemblies of said plurality of circuit board assemblies includes circuits that are application specific to a given one of a plurality of information channels of said system, and wherein a second one of said circuit board assemblies of said plurality of circuit board assemblies includes circuits that are common to all of said plurality of information channels, and a connector assembly for electrically interconnecting said first and second circuit board assemblies to provide a composite circuit board assembly that is application specific to an information channel with which it is used.

14. The assembly according to claim 13, wherein at least said first and second circuit board assemblies have component bearing surfaces, and wherein said first circuit board assembly is adapted to be mounted on said second circuit board assembly with the component bearing surface of said first circuit board assembly opposing the component bearing surface of said second circuit board assembly with components of said first and second circuit board assemblies being skylined with one another, and wherein said connector assembly mechanically interconnects said first and second circuit board assemblies enabling said composite circuit board assembly structure to be inserted as a unit into said enclosure.

15. The assembly according to claim 14, wherein a third circuit board assembly of said plurality of circuit board assemblies contains power supplying circuits for supplying electrical power signals to said first and second circuit board assemblies, said power supplying circuits being configurable to provide supply voltages at different magnitudes for said first and second circuit board assemblies as a function of the configuration of the application specific circuits of said first circuit board assembly.

16. The assembly according to claim 15, including a first power signal connector assembly connected between said second and third circuit board assemblies for connecting said supply voltages to said second circuit board assembly, and a second power signal connector connected between said first and second circuit board assemblies for extending said supply voltages from said second circuit board assembly to said first circuit board assembly.

17. The assembly according to claim 12, wherein said first and second sides of said enclosure include respective first and second side panels hinged to said bottom of said enclosure on opposite sides thereof and movable between a closed position in which said circuit board assemblies are enclosed within said enclosure and an open position in which access is provided to said circuit board assemblies.

18. The assembly according to claim 12, wherein at least one of said plurality of input/output modules includes a flexible sealing member made of metal and extending along one side of said enclosure, said sealing member engaging a side of a second one of said plurality of input/output modules that is located adjacent to said first input/output module, forming a seal between the junction of said first and second input/output modules for substantially preventing high frequency signal radiation through said junction from the interior of said housing.

19. The assembly according to claim 15, wherein said inner chamber of said housing defines a plenum that is located forwardly of said input/output modules, said plenum being communicated with open inner ends of said input/output modules, and air circulating means located within said plenum for circulating cooling air through said input/output modules, said input/output modules being constructed and arranged so that the volume of cooling air supplied to said composite circuit board assembly formed by said first and second circuit board assemblies is greater than the volume of cooling air supplied to said third circuit board assembly.

20. The assembly according to claim 19, wherein said metallic shield is constructed and arranged to permit cooling air to flow into said input/output modules from said plenum.

21. The input/output module according to claim 1, wherein the connection means includes a z-axis connector planar card and wherein the first and second connectors include connector sockets for receiving the z-axis connector planar card.

* * * * *